United States Patent [19]

Barton

[11] Patent Number: 4,634,652
[45] Date of Patent: Jan. 6, 1987

[54] OVERLAY LIGHT-SENSITIVE PROOFING FILM WITH TRANSPARENT ALUMINUM OXIDE AND TRANSPARENT MAGNESIUM FLUORIDE LAYERS THEREIN

[75] Inventor: O. Alfred Barton, Florham Park, N.J.

[73] Assignee: American Hoechst Corporation, Somerville, N.J.

[21] Appl. No.: 758,894

[22] Filed: Jul. 25, 1985

[51] Int. Cl.$^4$ .......................... G03C 1/80; G03C 1/84
[52] U.S. Cl. ..................................... 430/156; 430/157; 430/158; 430/161; 430/162; 430/143; 430/271; 430/275; 430/276; 430/293
[58] Field of Search ............... 430/157, 158, 161, 162, 430/166, 271, 272, 275, 276, 293, 143

[56] References Cited

U.S. PATENT DOCUMENTS

| | | | |
|---|---|---|---|
| 3,679,419 | 7/1972 | Gillich | 430/302 |
| 4,028,111 | 6/1977 | Iwasaki et al. | 430/191 |
| 4,078,935 | 3/1978 | Nakagiri et al. | 430/527 |
| 4,329,409 | 5/1982 | Wreede et al. | 430/1 |
| 4,332,880 | 6/1982 | Izu et al. | 430/272 |
| 4,333,983 | 6/1982 | Allen | 428/336 |
| 4,355,888 | 10/1982 | Pearson | 355/38 |
| 4,408,213 | 10/1983 | Bell | 430/945 |
| 4,426,437 | 1/1984 | Fisch et al. | 430/275 |
| 4,448,873 | 5/1984 | Walls et al. | 430/157 |
| 4,552,826 | 11/1985 | Fisch | 430/143 |
| 4,564,589 | 1/1986 | Hallman et al. | 430/275 |
| 4,578,684 | 3/1986 | Gupta et al. | 430/495 |
| 4,579,810 | 4/1986 | Johnson et al. | 430/293 |

Primary Examiner—Charles L. Bowers, Jr.
Attorney, Agent, or Firm—Richard S. Roberts

[57] ABSTRACT

This invention relates to an improved overlay proofing film. More, particularly, the invention relates to an improved overlay proofing film comprising a substantially transparent polyester base film which has deposed thereon a substantially uniform adhesive layer comprising aluminum oxide, which adhesive layer has deposed thereon a substantially uniform optical layer comprising magnesium fluoride, said polyester base film being coated on either side with a light sensitive mixture of
a. a resinous binder;
b. a colorant; and
c. a light sensitive material.

19 Claims, No Drawings

OVERLAY LIGHT-SENSITIVE PROOFING FILM WITH TRANSPARENT ALUMINUM OXIDE AND TRANSPARENT MAGNESIUM FLUORIDE LAYERS THEREIN

BACKGROUND OF THE INVENTION

The invention relates to an overlay proofing film having a base film with improved transparency. In the graphic arts, it is desirable to produce a four or more color proof to assist a printer in correcting a set of color prints prior to using them to produce color plates and also to reproduce the color quality that will be obtained during the printing process. The proof must be a consistent duplication of the half tone, and should neither gain nor lose color. Visual examination of a color proof should show the following characteristics:
1. Defects on the negative.
2. The best color rendition to be expected from press printing of the material.
3. The correct gradation of all colors and whether grays are neutral.
4. The need, if any, for subduing one of the colors and/or giving directions for altering the film negatives before making the printing plates.

A method of transferring colored images has been applied to the preparation of a color proofing sheet in multicolor printing. Thus, color proofing sheets, for multi-colored printing, have heretofore been made by using a printing press or a proof press while taking all the steps necessary for actual multicolor printing, but such a conventional method of color proofing has been costly and time consuming.

Photographic processes have also been used, especially photographic processes using photopolymers. The usual type of photographic color proofing method is the overlay type.

In the overlay type of color proofing method, an independent transparent plastic support is used for producing a print of each color separation film by applying a photosensitive solution of the corresponding color, and a plurality of such supports carrying prints of corresponding colors are then superimposed upon each other to produce a color proofing sheet. The overlay type of color proofing method has the disadvantage that the grayness and density of the superimposed plastic supports tend to darken the color proofing sheet, and, as a result, the impression of the color proofing sheet thus prepared becomes vastly different from copies actually obtained by a conventional printing press or a proof press. Its primary advantage is that it is quick and can serve as a progressive proof by combining any two or three colors in register.

As mentioned above, the typical proof sheet adapted for imagewise color exposure consists in the most elementary form of a transparent base sheet coated on one side with a light sensitive composition containing a dyestuff. Most commonly with negative acting materials, the light sensitive composition may be composed of a diazo material, used either alone or in combination with a resinous binder, which composition is caused to harden by exposure to a source of actinic light. The hardening occurs as the result of a photopolymerization, condensation, or coupling reaction which renders the light struck areas insoluble in common developer solutions such as aqueous developers, while the non-light struck areas remain substantially chemically unaltered and soluble. Once developed, the light struck areas of the coating exposed through a negative transparency remain adhered to the base sheet in the form of an image.

In order to overcome the above-stated darkening problem, it is desired that a proofing film be obtained wherein the base film has improved clarity and transparency.

SUMMARY OF THE INVENTION

This invention relates to an improved overlay proofing film. More, particularly, the invention relates to an improved overlay proofing film comprising a substantially transparent polyester base film which has deposed thereon a substantially uniform adhesive layer comprising aluminum oxide, which adhesive layer has deposed thereon a substantially uniform optical layer comprising magnesium fluoride, said polyester base film being coated with a light sensitive mixture of
a. a resinous binder;
b. a colorant; and
c. a light sensitive material.

DETAILED DESCRIPTION OF THE INVENTION

The present invention provides a proofing film wherein the polyester base film exhibits substantially improved transparency and clarity. In general, it has been found that a suitable antireflectance coating for polyester film should be transparent and have a refractive index (R.I.) lower than the refractive index of the polyester film itself (R.I. ~ 1.6). An oversimplification of the mechanism of this phenomena is that the lower R.I. coating makes the light entering the film more perpendicular and hence there is less angular stray light to bounce from surface to surface of the system. Reducing the amount of angular stray light reduces grayness and improves the transparency of the film.

The flexible polyester film of the present invention may be any flexible film formed from any thermoplastic film forming polyester which is produced by condensing a dicarboxylic acid or a lower alkyl diester thereof with a glycol. Among the dicarboxylic acids and their lower alkyl diesters which may be employed to form a flexible polyester film support are terephthalic; isophthalic; phthalic; 2,5-,2,6, and 2,7-naphthalene dicarboxylic; succinic; sebacic; adipic; azelaic; dibenzoic; the hexahydrophthalics; and bis-p-carboxyphenoxyethane. One or more of these acids and/or their lower alkyl diesters is reacted with one or more glycols which include ethylene glycol; diethylene glycol; 1,3-propanediol; 1,4-butanediol; neopentyl glycol or 1,4-cyclohexanedimethanol. Since one or more diesters may be reacted with one or more glycols, the polyester film of this invention is not limited to homopolyesters, but also includes mixed polyesters such as copolyesters.

Of the film forming polyesters within the contemplation of this invention, preferred are those containing at least a major amount of polyethylene terephthalate, the most preferred being polyethylene terephthalate. Polyethylene terephthalate film is formed from a polymer produced by polymerization of bis-(2-hydroxyethyl) terephthalate. Bis-(2-hydroxyethyl) terephthalate is itself formed as an intermediate by one of two different methods. One method for producing bis-(2-hydroxyethyl) terephthalate is by direct esterification of terephthalic acid with ethylene glycol as described in U.S. Pat. No. 3,050,533. In this method, the by-product of the reaction is water which is distilled from the reaction product. A second method for producing bis-(2-hydroxyethyl) terephthalate is by transesterification of a dialkyl ester of terephthalic acid, preferably dimethyl terephthalate, with ethylene glycol. Preferably, two molecular proportions of ethylene glycol react with one molecular proportion of the dialkyl terephthalate. More preferably, more than two molecular proportions of ethylene glycol per molecular proportion of the dialkyl terephthalate are used since under these conditions the initial transesterification reaction occurs more rapidly and completely. The transesterification reaction is conducted under conditions of elevated temperature. For example, a temperature in the range of between about the boiling temperature of the reaction mixture to as high as about 250° C. may be used. The reaction can occur at atmospheric, sub-atmospheric or super-atmospheric pressure. The by-product of the transesterification reaction is an alkanol. For example, if dimethyl terephthalate is used, methanol is produced. The alkanol is removed from the reaction product. In order to increase the reaction rate, many known catalysts may be employed in the transesterification reaction, as desired.

After the bis-(2-hydroxyethyl) terephthalate has been produced, it may be converted to polyethylene terephthalate by heating at a temperature above the boiling point of the ethylene glycol or the reaction mixture under conditions affecting the removal of the glycol or water. The heating may occur at a temperature as high as about 325° C., if desired. During heating, pressure is reduced so as to provide rapid distillation of the excess glycol or water. The final polyethylene terephthalate polymer may have an intrinsic viscosity, as measured in orthochlorophenol at 25° C., in excess of about 0.3 deciliter per gram. More preferably, the intrinsic viscosity of the polymer ranges from about 0.4 to about 1.0 deciliter per gram, again measured in orthochlorophenol at 25° C. Still more preferably, the polyethylene terephthalate employed in the present invention has an intrinsic viscosity of about 0.5 to about 0.7 deciliter per gram as measured in orthochlorophenol at 25° C.

In a preferred embodiment, the polyester film forming polymer is melted and thereafter extruded onto a polished revolving casting drum to form a cast, flexible sheet of the polymer. Thereafter, the film is axially stretched in one direction, either in the direction of extrusion (longitudinal), or perpendicular to the direction of extrusion (transverse) in the case of monoaxially oriented film, and in two directions in the case of biaxially oriented film, that is, the film is stretched in both the longitudinal and transverse directions. The first stretching step of the cast sheet may be in either or these two orthogonal directions. The amount of stretching, to impart strength and toughness to the film, can range from about 3.0 to about 5.0 times the original cast sheet dimension in one or both directions. Preferably, the amount of stretching is in the range of between about 3.2 and 4.2 times the original dimension. The stretching operations are carried out at temperatures in the range of from about the second order transition temperature to below the temperature at which the polymer softens and melts. It is important that the stretching temperature is above the glass transition temperature of the film. The film is then crystallized by heating to a temperature of from about 130° C. to about 240° C., preferably 150° C. to 180° C., while being transversely restrained but without film stretching. Crystallizing is normally complete when this treatment is performed for about five seconds or more. The film is then cooled to substantially ambient atmospheric room temperature. The thusly produced film may have a thickness of from 0.48 to 30 mils, preferably 1 to 9 mils, most preferably 3 to 7 mils.

The thusly formed polyester film has deposited thereon a substantially uniform transparent, adhesive film layer comprising aluminum oxide and, on said adhesive layer, a substantially uniform transparent film layer comprising magnesium fluoride, such as disclosed in U.S. Pat. No. 4,333,983, the disclosure of which is hereby incorporated herein by reference. It has been found that the aluminum oxide layer substantially eliminates the difficulty of achieving sufficient adherence between the magnesium fluoride optical layer and the polyester substrate.

The aluminum oxide is applied to the surface of the film by vacuum deposition techniques which are known to those skilled in the art. For instance, this may be effected by heating the aluminum oxide in a high vacuum, preferably in the range of about $10^{-3}$ to about $10^{-5}$ torr, to a temperature above its melting point such that the vapor pressure of the aluminum oxide exceeds about $10^{-2}$ torr or it may be effected by subjecting the aluminum oxide to a stream of bombarding ions whereby the aluminum oxide is removed by mass transfer "sputtering". When these conditions are achieved, the aluminum oxide is vaporized or sputtered, emitting vapor or atoms in all directions. These vapors or atoms impinge on the film surface, condense and thereby form the aluminum oxide layer on the film.

The aluminum oxide adhesive layer, in that it has an index of refraction close to that of the polyester base film (R.I. $Al_2O_3 \sim 1.63$), is essentially passive from an optical standpoint. Preferably the aluminum oxide is coated on the polyester base film at a thickness of at least about 170 nanometers and preferably should not exceed about 340 nanometers. Most preferably, the thickness of the aluminum oxide layer should be maintained at as close to 170 nanometers as possible. As is demonstrated in U.S. Pat. No. 4,333,983, the minimum thickness value for the aluminum oxide adhesive layer is important in achieving optimum adherence of the magnesium fluoride layer. The maximum thickness is mainly of importance only in maintaining film clarity as high as possible.

Magnesium fluoride layer (R.I. $\sim 1.38$) serves as an antireflection layer and is preferably vacuum deposited in the manner described hereinabove on top of the aluminum oxide layer to a thickness which is preferably from about 75 to about 125 nanometers and, most preferably, which is about 100 to about 103 nanometers.

Preferably the magnesium fluoride layer is cross-linked after deposition in order to prevent any wash-off or disturbance thereof which may be caused by the solvents used in the coating of the light sensitive layer. The cross-linking may be accomplished by any manner known to those skilled in the art, such as by electron-beam treatment.

The polyester film having the magnesium fluoride layer thereon is then coated with a light sensitive mixture of
(a) a resinous binder;
(b) a colorant; and
(c) a light sensitive material.

The components of the light sensitive mixture of the present invention may be the conventional components which are known in the art for such coatings used in positive acting or negative acting light sensitive systems. The resinous binder material may be any of the known prior art binders which have been disclosed either for positive acting or negative acting light sensitive coating compositions which is compatible with the other components and which preferably has a refractive index less than that of polyester film.

In negative acting systems, the binder material may be relatively inert to photochemical reaction, serving merely as a carrier for the light sensitive materials, colorants, and other additives which may be present in the coating composition. Exemplary of suitable binder materials include cellulose esters such as cellulose acetate, cellulose acetate succinate and cellulose acetate butyrate; polyvinyl acetals such as polyvinylbutyral and polyvinyl formal; polyamide resins; copolymers of vinyl chloride with polar monomers such as acrylonitrile, acrylic or methacrylic acid or their esters, and with vinyl acetate; polymeric esters such as polyvinyl acetate or copolymers of vinyl acetate with acrylic acid, methacrylic acid and their esters, or with maleic acid or maleic anhydride; copolymers of styrene with acid functional comonomers such as ethyl acrylate, vinyl acetate and maleic anhydride; natural polymers such as gelatin, casein or fish glue; polyvinyl alcohol; polyacrylamides; and like materials. In a positive acting system, the resinous binder materials most commonly employed are selected from alkali soluble resins such as phenol/formaldehyde novolak resins and like materials. Preferably, the binder material is a copolymer of polymethyl methacrylate and methacrylic acid.

The coloring agents employed in the present invention include those dyestuffs and pigments which are known in the art and which have colors substantially identical with the standard colors of inks required for color proofing, e.g. yellow, cyan, magenta and black. Examples of suitable colorants include Grasol Fast Yellow 5FL (C.I. Solvent Yellow 27), Grasol Fast Rubine 2BL (C.I. Solvent Red 128), Victoria Pure Blue FGA (C.I. Basic Blue 81), Neozapon Yellow GG (C.I. Solvent Yellow 79), Neozapon Fast Red BE (C.I. Solvent Red 122), Sudan Blue II (C.I. Solvent Blue 35-C.I. 6155(S), Victoria Cyan F6G (C.I. 42025), Rhodamine FB (C.I. 45170), Rhodamine 6GDN Extra (C.I. 45160), Auramine Concentrate (C.I. 41000), carbon black and like materials.

Light sensitive materials which are preferably used in the practice of the present invention include any suitable light-sensitive diazonium salt which are well known to the skilled artisan. Preferred are the polymeric diazonium compounds including those condensed with formaldehyde such as disclosed in U.S. Pat. Nos. 2,063,631 and 2,667,415, the polycondensation products such as disclosed in U.S. Pat. Nos. 3,849,392 and 3,867,147, and the high speed diazos such as disclosed in U.S Pat. No. 4,436,804, all of which are hereby incorporated herein by reference.

The most preferred of these diazonium salts is the condensation product of 3-methoxy-4-diazo diphenyl amine and 4,4'-bis-methoxy methyl diphenyl ether, isolated as the mesitylene sulfonate, such as is taught in U.S. Pat. No. 3,849,392.

Other compositions useful as the light sensitive material of this invention include those photomonomers or oligomers in conjunction with a photoinitiator wherein the solvent system used to apply them to the film is not so hard or severe as to interfere with the non-light sensitive composition already coated on the film.

It is to be emphasized that the specific light sensitive compositions which may be employed in the present invention are conventional in the art and should be selected by one skilled in the art based on compatibility and operability in the binder system disclosed herein.

The light sensitive coating compositions may be most conveniently applied to the film substrate by forming a solution or dispersion of the coating ingredients in suitable solvent(s), applying the desired quantity of the solution to the surface of the film by any suitable technique such as roller coating, dip coating, miniscus coating, doctor blade coating or whirler coating, and drying to evaporate the solvent although there may be some residue remaining. The light sensitive coating composition may be coated on either side of the coated polyester base film, even if the non-light sensitive first coating is coated on only one side of the polyester base film. Suitable solvents which may be employed should be selected based on the solubility characteristics of the light sensitive compositions and include dimethyl sulfoxide, dimethyl formamide, tetrahydrofuran, glycol ethers such as propylene glycol mono methyl ether, ethylene glycol mono methyl ether and ethylene glycol mono ethyl ether, esters such as ethyl acetate, butyl acetate and amyl acetate; ketones such as methyl ethyl ketone, cyclohexanone and diacetone alcohol, and mixtures thereof.

The composition of the photosensitive coating on a dry basis generally should range in the order of about 25 to 75% by weight of binder material. An effective amount of a colorant is generally in the range of about 2 to 15% by weight and effective amounts of the light sensitive materials as are known in the art. The concentration of the solids in the coating solution prior to application to the substrate and drying depends upon the coating method used in depositing the coating, but generally solutions containing from about 2 to 20% by weight solids are satisfactory.

In the preferred embodiment, the second coating is present at a coating weight of from about 0.35 g/m$^2$ to about 2.5 g/m$^2$. More preferably, the second coating is present at about 0.80g/m$^2$ to about 1.5 g/m$^2$. The most preferred coating weight for the second coating is about .0.90 g/m$^2$.

The thusly prepared overlay proofing film may then be exposed to actinic light through a suitable mask or contact flat and then developed with an aqueous alkaline developer. Suitable developers may include components such as monosodium phosphate, trisodium phosphate and the sodium sulfate derivative of 7-ethyl-2-methyl-4-undecanol.

The following examples illustrate the invention but it is understood that the invention is not limited thereto.

EXAMPLE 1

The transparency of films prepared according to this invention is compared spectrophotometrically to the transparency of Melinex 505, a polyester film subbed with an adhesion promoter to improve clarity, obtained from I.C.I., Melinex 516, a polyester film subbed with nodules of silica to facilitate handling and eliminate the effects of static, obtained from I.C.I., and cellulose acetate film obtained from Anitec. The transparency of 1 through 4 layers of the respective films is measured and the results are shown in Table 1.

TABLE 1

| Layers | Inventive Film | Melinex 505 I.C.I. | Melinex 516 I.C.I. | Cellulose Acetate Anitec |
|---|---|---|---|---|
| 1 | .005 | .049 | .057 | .033 |
| 2 | .019 | .100 | .114 | .073 |
| 3 | .033 | .152 | .172 | .114 |
| 4 | .048 | .203 | .225 | .155 |

EXAMPLE 2

A light sensitive composition is prepared by dissolving 2.7 g of a copolymer of 85% polymethyl methacrylate/15% methacrylic acid binder in a solvent mixture comprising 43.7g of methyl ethyl ketone and 43.7 g of propylene glycol methyl ether under moderate stirring. The following dyes are then added: 0.037 g of Victoria Cyan F6G and 0.714 g of Victoria Pure blue FGA, while mixing. While the solution is still being mixed, 1.067 g of the condensation product of 3-methoxy-4-diazo diphenyl amine sulfate and 4,4'-bis-methoxy methyl diphenyl ether isolated as the mesitylene sulfonate is added followed by 8.077 g of hydroxy propyl cellulose, available as Klucel MF from Hercules Corp., as a 1.5% solution in propylene glycol methyl ether. The entire formulation is stirred for thirty minutes after all the components have been added to insure complete mixing.

A Meyer bar drawdown is then used to apply this formulation to film prepared according to this invention, and then dried for 1 minute at 150° F. The coated film is then exposed through a negative for twenty units on a Berkey-Ascor exposure unit and developed by hand with an aqueous alkaline developer comprising trisodium phosphate, monosodium phosphate, the sodium sulfate derivative of 7-ethyl-2-methyl-4-undecanol available as Niaproof 4 from Niacet Co. and water. The images developed with no evidence of residual stain and with superior image crispness due to the superior clarity of the film. The transparency of the developed film is measured as 0.011.

EXAMPLE 3

A light sensitive composition is prepared by dissolving 2.7 g of a copolymer of 85% polymethyl methacrylate/15% methacrylic acid binder in a solvent mixture comprising 41.5 g of methyl ethyl ketone and 41.5 g of propylene glycol methyl ether under moderate stirring. The following dyes are then added: 0.4 g of calcozine yellow SFW, 0.2 g of Rhodamine 6GDN and 0.1 g of Victoria Pure blue FGA, while mixing. While the solution is still being mixed, 1.7 g of the condensation product of 3-methoxy-4-diazo diphenyl amine sulfate and 4,4'-bis-methoxy methyl diphenyl ether isolated as the mesitylene sulfonate is added followed by 3.0 g of hydroxy propyl cellulose, available as Klucel MF from Hercules Corp., as a 1.5% solution in propylene glycol methyl ether. The entire formulation is stirred for thirty minutes after all the components have been added to insure complete mixing.

A Meyer bar drawdown is then used to apply this formulation to film prepared according to this invention, and then dried for 1 minute at 150° F. The coated film is then exposed through a negative for thirty units on a Berkey-Ascor exposure unit and developed by hand with an aqueous alkaline developer comprising trisodium phosphate, monosodium phosphate, the sodium sulfate derivative of 7-ethyl-2-methyl-4-undecanol available as Niaproof 4 from Niacet Co. and water. Again, the images developed with no evidence of residual stain and with superior image crispness due to the superior clarity of the film. The transparency of the developed film is measured as 0.010.

I claim:

1. An improved overlay proofing film comprising a substantially transparent polyester base film which has vapor deposit thereon a substantially uniform transparent adhesive layer comprising aluminum oxide, which adhesive layer has vapor deposited thereon a substantially uniform transparent optical layer comprising magnesium fluoride, which optical layer has a coating thereon comprising a light sensitive mixture of
   (a) a resinous binder in sufficient quantity amount to function as binder for binding the colorant and the light-sensitive material in a coating;
   (b) a colorant in sufficient quantity amount to enable a color of a color proofing image to be obtained in a coating; and
   (c) a positive acting or negative acting light sensitive material in sufficient quantity amount to form a color proofing image in an actinic light imaged and developed coating.

2. The proofing film of claim 1 wherein said aluminum oxide coating is present on said polyester base film at a thickness of about 170 nanometers.

3. The proofing film of claim 1 wherein said magnesium fluoride coating is present on said adhesive layer at a thickness of from about 75 to about 125 nanometers.

4. The proofing film of claim 1 wherein said resinous binder has an index of refraction below that of said polyester base film.

5. The proofing film of claim 3 wherein said magnesium fluoride coating is present on said adhesive layer at a thickness of from about 100 to about 103 nanometers.

6. The proofing film of claim 1 wherein said resinous binder is a polymer which contains carboxyl groups in or pendant to the polymer chain.

7. The proofing film of claim 6 wherein said resinous binder is a copolymer containing polymerized maleic anhydride or vinyl acetate monomers.

8. The proofing film of claim 7 wherein said resinous binder is a copolymer of styrene and maleic anhydride.

9. The proofing film of claim 1 wherein said resinous binder is a novolak resin.

10. The proofing film of claim 1 wherein said resinous binder is a copolymer of polymethyl methacrylate and methacrylic acid.

11. The proofing film of claim 1 wherein said light sensitive material is selected from the group consisting of a negative working diazonium salt, a composition comprising a photomonomer in conjunction with a photoinitiator and a composition comprising a photo-oligomer in conjuction with a photoinitiator.

12. The proofing film of claim 11 wherein said light sensitive material comprises a negative working diazonium salt.

13. The proofing film of claim 12 wherein said diazonium salt comprises the condensation product of 3-methoxy-4-diazo diphenylamine sulfate and 4,4'-bis-methoxy methyl diphenyl ether isolated as the mesitylene sulfonate.

14. The proofing film of claim 1 wherein said polyester base film comprises a film of polyethylene terephthalate.

15. The proofing film of claim 1 wherein said adhesive layer is coated on both sides of said polyester base film.

16. The proofing film of claim 15 wherein said optical layer is coated on said adhesive layer on both sides of said polyester film base.

17. The proofing film of claim 16 wherein said light-sensitive mixture is coated on top of said optical coating on both sides of the polyester film base.

18. The proofing film of claim 16 wherein said optical layer is cross-lined prior to coating with said light sensitive mixture.

19. The proofing film of claim 17 wherein said optical layer is cross-linked prior to coating with said light sensitive mixture.

* * * * *